United States Patent
Wellhausen et al.

(10) Patent No.: US 6,815,234 B2
(45) Date of Patent: Nov. 9, 2004

(54) REDUCING STRESS IN INTEGRATED CIRCUITS

(75) Inventors: Uwe Wellhausen, Kanagawa (JP); Stefan Gernhardt, Kanagawa (JP); Rainer Bruchhaus, Kanagawa (JP); Andreás Hilliger, Kanagawa (JP); Jing Yu Lian, Tokyo (JP); Nicolas Nagel, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/248,253

(22) Filed: Dec. 31, 2002

(65) Prior Publication Data

US 2004/0124452 A1 Jul. 1, 2004

(51) Int. Cl.[7] ............................................. H01L 21/66
(52) U.S. Cl. ......................................... 438/15; 438/14
(58) Field of Search ............................ 438/14, 15, 457, 438/464, 795, 492, 503, 683, 455, 458, 459, 791; 257/417, 419, 426, 295, 635, 636, 637

(56) References Cited

U.S. PATENT DOCUMENTS

| | | | | |
|---|---|---|---|---|
| 4,545,037 | A | * | 10/1985 | Nakano et al. |
| 5,306,946 | A | * | 4/1994 | Yamamoto |
| 5,844,832 | A | * | 12/1998 | Kim |
| 6,096,434 | A | * | 8/2000 | Yano et al. |
| 6,127,288 | A | * | 10/2000 | Kiyama |
| 6,151,243 | A | * | 11/2000 | Kim |
| 6,306,721 | B1 | * | 10/2001 | Teo et al. |
| 2001/0022372 | A1 | * | 9/2001 | Kanaya et al. |
| 2002/0076625 | A1 | * | 6/2002 | Shoki et al. |

FOREIGN PATENT DOCUMENTS

JP          05-267293  A  * 10/1993

* cited by examiner

Primary Examiner—Nathan J. Flynn
Assistant Examiner—Kevin Quinto
(74) Attorney, Agent, or Firm—Horizon IP Pte Ltd

(57) ABSTRACT

A semiconductor chip in which stress on the effective stress on the substrate is reduced in order to reduce bowing. To reduce the effective stress, a stress compensation layer is provided on the backside of the chip. The stress compensating layer produces a stress opposite of that produced by the IC. Thus the overall or effective stress on the substrate is reduced.

10 Claims, 4 Drawing Sheets

101

101

REDUCING STRESS IN INTEGRATED CIRCUITS

BACKGROUND OF INVENTION

FIG. 1 shows an integrated circuit chip 101. The chip comprises an IC 130 formed on a surface of a substrate 110. The IC comprises various components, such as transistors, resistors and capacitors. The components are interconnected to create the desired functions. One or more passivation layers can be provided over the components for protection from, for example, moisture.

Ferroelectric metal oxide ceramic materials such as lead zirconate titanate (PZT) or strontium bismuth tantalate (SBT) are used to form certain components, such as capacitors. The capacitors can be used to form ferroelectric memory cells. A ferroelectric memory cell stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric memory cell is that it retains its polarization state after power is removed, resulting in a non-volatile memory cell.

The various materials of the IC, after processing, may produce an overall stress (referred to as remaining stress). The remaining stress, for example, can be tensile stress (e.g., expansive). Such remaining stress can create bowing in the substrate on which the IC is formed, as shown in FIG. 2. However, some components, such as ferroelectric capacitors, have been found to be very sensitive to mechanical stress. For example, local stress in the ferroelectric devices has been found to adversely impact device performance and reliability.

From the foregoing discussion, it is desirable to provide an IC which avoids the adverse impact of stress resulting from processing.

SUMMARY OF INVENTION

The invention relates to semiconductor processing. In particular, the invention relates to compensating for stress on a substrate resulting from semiconductor processing. In one embodiment, a semiconductor chip comprising an IC formed on a first surface of a substrate. The IC produces a remaining stress of a first type on the substrate. On a second surface of the substrate, a stress compensating layer is provided. The stress compensating layer produces a stress of a second type, which is opposite of the remaining stress. As a result, the stress compensating layer reduces the effective stress on the ferroelectric device, thus compensating for stress which can adversely affect performance and reliability.

In one embodiment, the stress compensating layer comprises a dielectric layer. The dielectric layer preferably comprises silicon nitride or silicon oxide. In a preferred embodiment, the dielectric material is deposited using plasma enhanced CVD. Such techniques advantageously enable the stress compensating layer to be tuned with specific stress characteristics.

DETAILED DESCRIPTION

The invention relates generally to the fabrication of ICs. Generally, a plurality of ICs are formed on a semiconductor substrate, such as a silicon wafer, simultaneously. The sequence of process steps of forming the components on the wafer, including depositing the final passivation over the components, is referred to as the front-end process. After the front-end process is finished, the wafer is diced to separate the ICs into individual chips. The chips are then packaged, resulting in a final product that is used in, for example, consumer products such as computer systems, cellular phones, personal digital assistants (PDAs), and other electronic products. In particular, the invention relates to reducing stress in ICs that can adversely impact performance and reliability.

Figure 1:
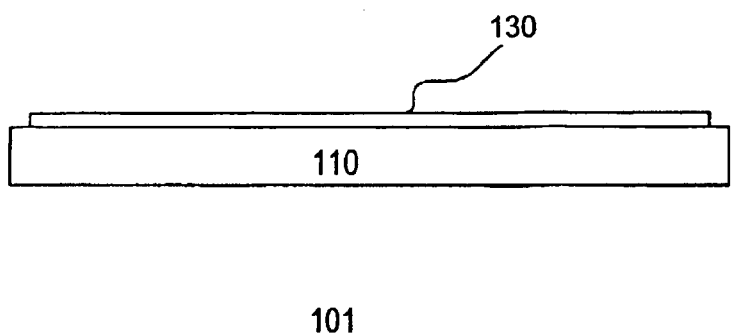
FIGS. 1–2 show an integrated circuit and affects of mechanical stress.
Figure 2:
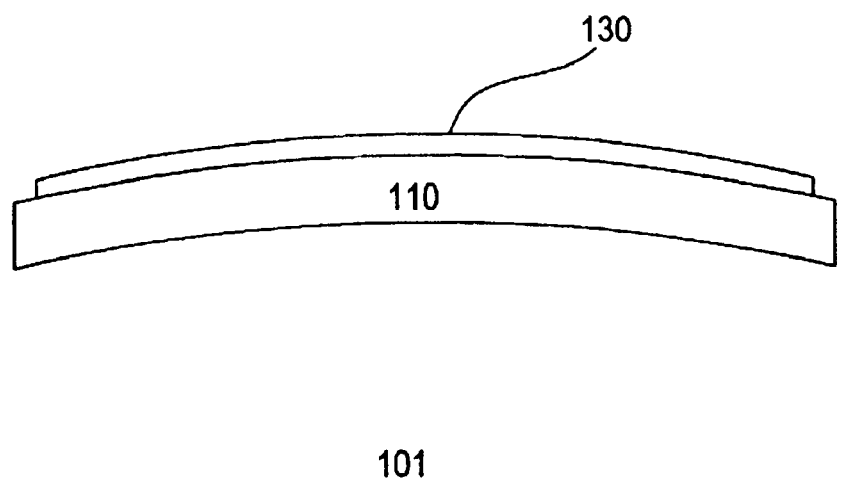
Figure 3:
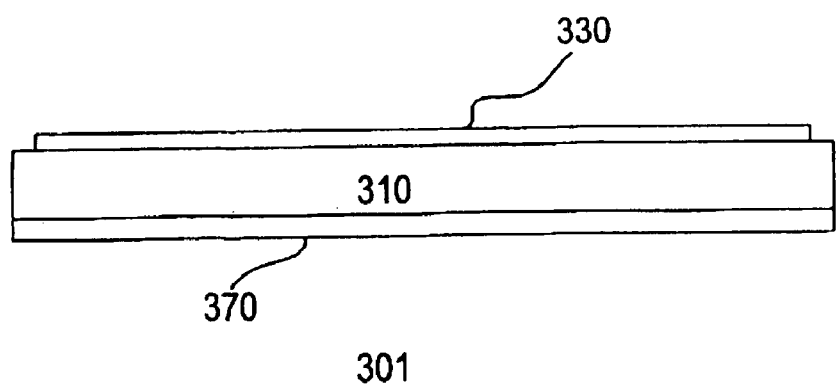
FIG. 3 shows an integrated circuit in accordance with one embodiment of the invention.

FIG. 3 shows a semiconductor chip 301 in accordance with one embodiment of the invention. As shown, the chip comprises a substrate 310. The substrate, for example, is a semiconductor wafer comprising silicon. Other types of substrates can also be useful. An IC 330 is formed on a first (top) surface of the substrate.

In one embodiment, the IC comprises ferroelectric components, such as memory cells. The memory cells, for example, are interconnected to form a memory array. The cells of the memory array can be arranged in various types of architectures, such as open or folded. Other types of architectures, such as series architectures, are also useful. Series architectures are described in, for example, US patent titled "Semiconductor Memory Device and Various Systems Mounting Them", U.S. Pat. No. 5,903,492, filed on Jun. 10, 1997, which is herein incorporated by reference for all purposes. In one embodiment, the memory array along with controlling or support circuitry forms a memory IC. Forming other types of ICs is also useful.

As previously discussed the front-end process results in depositing various layers on the substrate to form the IC. The front-end process can produce a remaining stress, which can create local stress on the device. This can adversely impact device performance. Additionally, the remaining stress can cause the substrate to bow. The substrate would bow to form a concave shape in the presence of compressive stress or convex shape in the presence of tensile stress. The greater the amount of stress, the more the substrate would bow. The amount of remaining stress can easily be measured using, for example, optical techniques. Such techniques are described in, for example, Milton Ohring, "The Materials Science of Thin Films, Academic Press, Inc., Boston 1991, which is herein incorporated by reference for all purposes.

In accordance with the invention, a stress compensating layer 370 is provided on the second (bottom) surface of the substrate. The stress compensating layer, in one embodiment, creates a stress (compensating stress) which is opposite of the remaining stress. The compensating stress offsets the effects of the remaining stress, thus reducing bowing of the substrate.

In a preferred embodiment, the stress compensating layer introduces a compensating stress which is substantially equal to about that of the remaining stress. For example, if the remaining stress produced by the front end process is about $5\times10^3$ mPa of tensile stress, the stress compensating layer would be selected to cause about the same magnitude of compressive stress. More preferably, the stress compensating layer produces a compensating stress which also takes into account of the stress later introduced by the package. Depending on the type of stress created by the package relative to that of the remaining stress, the compensating stress could be increased or decreased. For example, if the package and remaining stress are of the same type (e.g., tensile), the compensating stress would be increased to accommodate for the added stress. On the other hand, if the stresses are of the opposite type, then the compensating stress would be reduced by about an amount equal to the package stress.

In one embodiment, the stress compensating layer comprises a dielectric material as the compensating layer. Other types of dielectric or non-dielectric materials can also be used. For example, conductive materials such as metals could be used. The stress which the stress compensating layer produces depends on the material used and/or its thickness. Various techniques can be used to form the stress compensating layer, depending on the material used. For example, dielectric materials can be deposited by chemical vapor deposition (CVD) while metal by sputtering.

In a preferred embodiment, the stress compensation layer comprises a dielectric material such as silicon nitride or oxide. The dielectric material is preferably deposited by plasma-enhanced CVD (PECVD). Plasma-enhanced CVD is preferred since such techniques advantageously enables the dielectric material to be deposited with the desired stress characteristics (e.g., tunable). For example, the dielectric layer can be tuned to have the desired stress orientation (e.g., compressive or tensile). The magnitude of the stress can be determined by, for example, the thickness of the stress compensating layer.

Figure 4:
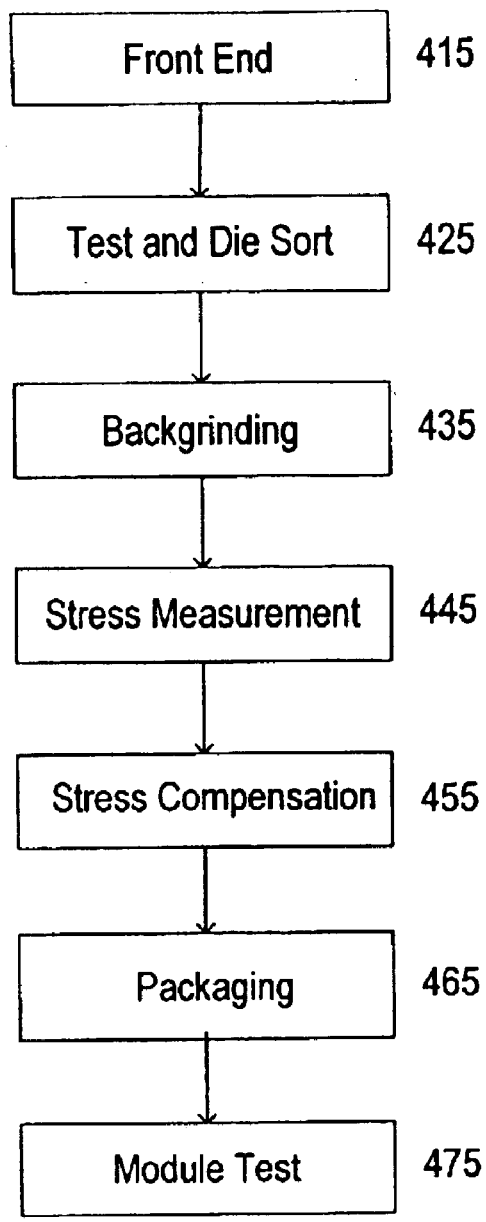
FIG. 4 shows a process flow of forming an IC in accordance with one embodiment of the invention.

FIG. 4 shows a process flow 403 for forming an integrated circuit in accordance with one embodiment of the invention. Typically, a plurality of ICs are fabricated on a semiconductor wafer in parallel. Various types of ICs can be fabricated. In one embodiment, ferroelectric memory ICs are fabricated on the wafer. Fabricating other types of ICs is also useful. The front-end process of a ferroelectric memory IC comprises, for example, ferroelectric memory cell (transistor and capacitors), support circuitry, and metallization modules. After the front-end process is completed at step 415, the wafer is tested and sorted at step 425.

In general, the wafer is processed with a thickness which is greater than necessary to facilitate processing and handling. In such case, the backside of the wafer may be grinded to reduce its thickness after testing and sorting. Backgrinding the wafer prior to testing and sorting is also useful. By reducing the thickness of the wafer, the over thickness of the final packaged chip can be reduced. In one embodiment, the stress on the wafer from front end processing is performed at step 435 to determine the stress on the wafer. If no backgrinding is performed, the stress on the wafer can be measured after front-end processing or testing.

Once the stress is determined, a stress compensation layer in accordance with the invention is formed on the backside of the wafer. The stress compensation layer introduces a compensating stress on the wafer. The compensating stress reduces, for example, local stress on the IC. In another embodiment, the compensating stress also takes into account of the stress asserted by the subsequent package. After formation of the stress compensation layer, the wafer is diced, separating the ICs into chips. The chips are then packaged at step 465. The packaged ICs are tested for defects at step 475.

In other embodiments, the stress compensation layer can be formed on the substrate during other parts of the process flow. The stress compensation layer can be formed on the backside of the substrate at any point in the process prior to packaging. Preferably, the stress compensation layer is formed prior to dicing the wafer. This is particularly useful for process flows which do not involve grinding the back of the wafer or providing protective layer on the backside of the wafer to protect against cross-contamination of tools or contamination of the wafer.

The stress induced on the wafer can be measured, for example, after front-end processing. The result of the measurement can be applied as a general rule to fabricating a specific type of IC. The stress from the package can also be taking into consideration when determining the compensating stress. Since the package is formed at the final process, it can be estimated or actually measured. For actual measurements, it may be useful to sample a large population and take the mean value as the measured value.

In another embodiment, a stress compensation layer is provided for a specific wafer. In such case, the remaining stress on the wafer is measured after front-end processing. The stress compensation layer is selected or tuned to produce a compensating stress to offset the measured stress value. Preferably, the stress compensation layer also factors in the stress from the package. The application of stress compensation layer to compensate for remaining stress of a specific wafer can be facilitated by deposition techniques which can tune the stress characteristics.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of fabricating an IC comprising:

performing front-end processes on a substrate to completely form the IC on a first surface of the substrate;

determining a remaining stress on the substrate caused by various layers of the IC used in the front-end processes; and forming a stress compensating layer on a second surface of the substrate, the second surface being opposite the first surface, the stress compensating layer introduces a compensating stress on the substrate to reduce the effects of the remaining stress on the substrate.

2. The method of claim 1 wherein the compensating stress also takes into account of a package stress produced by a package of the integrated circuit.

3. The method of claim 1 wherein the compensating stress reduces a local stress on the integrated circuit.

4. The method of claim 1 wherein the compensating stress also takes into account of a package stress produced by a package of the integrated circuit to reduce a local stress on the integrated circuit.

5. The method of claim 1, 2, 3 or 4 wherein the remaining stress is determined from a sample substrate formed with the IC, sampling of substrates formed with the IC, or calculated from the various layers used to form the integrated IC.

6. The method of claim 5 wherein forming the stress compensating layer comprises depositing materials of the stress compensating layer with tunable stress characteristics.

7. The method of claim 5 wherein the compensating layer comprises a dielectric material deposited with tunable stress characteristics.

8. The method of claim 5 further comprises backgrinding the second surface of the substrate prior to determining the remaining stress.

9. The method of claim 8 wherein forming the stress compensating layer comprises depositing materials of the stress compensating layer with tunable stress characteristics.

10. The method of claim 8 wherein the compensating layer comprises a dielectric material deposited with tunable stress characteristics.

* * * * *